United States Patent
Birner et al.

(10) Patent No.: US 6,919,255 B2
(45) Date of Patent: Jul. 19, 2005

(54) SEMICONDUCTOR TRENCH STRUCTURE (75) Inventors: Albert Birner, Dresden (DE); Matthias Goldbach, Dresden (DE); Thomas Hecht, Dresden (DE); Lars Heineck, Dresden (DE); Stephan Kudelka, Ottendorf-Okrilla (DE); Jörn Lützen, Dresden (DE); Dirk Manger, Dresden (DE); Andreas Orth, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/630,373

(22) Filed: Jul. 30, 2003

(65) Prior Publication Data
US 2004/0126961 A1 Jul. 1, 2004

(30) Foreign Application Priority Data
Jul. 31, 2002 (DE) .......................... 102 34 952

(51) Int. Cl.⁷ .............................................. H01L 21/20

(52) U.S. Cl. ..................... 438/386; 438/388; 438/389; 438/391; 438/561; 438/700

(58) Field of Search ................................. 438/243, 245, 438/246, 386, 388, 389, 391, 561, 700

(56) References Cited

U.S. PATENT DOCUMENTS

| | | | | |
|---|---|---|---|---|
| 5,877,061 A | * | 3/1999 | Halle et al. | 438/386 |
| 6,025,272 A | * | 2/2000 | Yu et al. | 438/697 |
| 6,207,494 B1 | * | 3/2001 | Graimann et al. | 438/248 |
| 6,455,369 B1 | | 9/2002 | Forster et al. | |
| 6,528,384 B2 | | 3/2003 | Beckmann et al. | |
| 6,680,249 B2 | * | 1/2004 | Lu et al. | 438/653 |
| 2002/0197823 A1 | * | 12/2002 | Yoo et al. | 438/424 |

FOREIGN PATENT DOCUMENTS

| | | |
|---|---|---|
| DE | 100 14 920 C1 | 7/2001 |
| DE | 100 40 464 A1 | 2/2002 |

* cited by examiner

*Primary Examiner*—Amir Zarabian
*Assistant Examiner*—Thanh Y. Tran
(74) *Attorney, Agent, or Firm*—Fish & Richardson P.C.

(57) ABSTRACT

A method for fabricating a semiconductor trench structure includes forming a trench in a semiconductor substrate and filling it with a filler. A first thermal process having a first maximum temperature cures the filler. Removing the filler from an upper region of the trench as far as a boundary surface defines a collar region. In a second thermal process having a second maximum temperature that is not significantly higher than the first maximum temperature, a liner is deposited on the collar region and the boundary surface. The liner is removed from the boundary surface, thereby exposing the filler. The filler is then removed from a lower region of the trench.

18 Claims, 9 Drawing Sheets

SEMICONDUCTOR TRENCH STRUCTURE

RELATED APPLICATIONS

This application claims priority from German Application Ser. No. 102 34 952.5, filed Jul. 31, 2002, the contents of which are incorporated herein by reference.

TECHNICAL FIELD

The present invention relates to a method for fabricating a semiconductor structure having a trench, in particular for use in the fabrication of a trench capacitor.

BACKGROUND

Although they can be applied to any desired semiconductor structures having a trench, the present invention and the problem on which it is based are explained on the basis of the fabrication of a trench capacitor.

Integrated circuits (ICs) or chips use capacitors for the purpose of charge storage. An example of an IC which uses capacitors for storing charges is a memory IC, such as for example a chip for a dynamic random access memory (DRAM). The charge state ("0" or "1") in the capacitor in this case represents one data bit.

One type of capacitor which is customarily employed in DRAMs is a trench capacitor. A trench capacitor is a three-dimensional structure formed in the silicon substrate. The volume or capacitance of the trench capacitor can be increased by etching more deeply into the substrate. In this case, the increase in the capacitance in the trench capacitor does not enlarge the surface area of the memory cell which is taken up by the wafer at all.

A standard trench capacitor includes a trench etched into the substrate. This trench is typically filled with $n^+$-doped polysilicon which acts as a capacitor electrode (also known as a storage capacitor). A second capacitor electrode (also known as a "buried plate") is optionally formed by outdiffusion of $n^+$-dopants from a dopant source into a region of the substrate which surrounds the lower section of the trench. An $n^+$-doped silicate glass, such as an arsenic-doped silicate glass (ASG), in this case serves as the dopant source. A storage dielectric which contains nitride is customarily used to insulate the two capacitor electrodes.

A dielectric collar is produced in the upper region of the trench in order to prevent a leakage current from the capacitor terminal with the buried plate. The storage dielectric in the upper region of the trench, where the collar is to be formed, is removed before the latter is formed. Removing the nitride prevents a vertical leakage current along the collar.

It is also known to produce a sacrificial collar in the upper region of a deep trench in order to enable certain processes to be carried out in the lower region of the trench, the intention being that these processes should leave the upper region of the trench unaffected. This sacrificial collar is then removed again after these certain processes have been carried out, and finally the electrically insulating insulation collar is built up in the upper region of the trench.

The fact that known concepts for fabricating sacrificial collars or insulation collars cannot readily be scaled, since they are based on an undoped polysilicon filling which for small design dimensions has an increasing tendency to form long voids, has proven to be a problem of such concepts. These voids make it impossible to control the further procedure.

SUMMARY

It is an object of the present invention to provide an improved method for fabricating a semiconductor structure having a trench, in particular for use in the fabrication of a trench capacitor, which can be scaled more successfully.

The present invention makes it possible to integrate a scalable collar in the upper region of a deep trench, for which purpose a thermally stable filler material which is liquid and/or able to flow, has no tendency to form voids, bonds to the side walls of the trench and has very good planarization properties on the semiconductor wafer is selected.

The idea on which the present invention is based therefore resides in the selection of a material of this type which can be introduced into structures with a high aspect ratio, has little shrinkage, can withstand high thermal loads and can be etched and stripped without problems as an underfill for the vertical patterning of the collar in conjunction with a thermal process which preferably takes place at between 400° C. and 500° C.

The collar concept according to the present invention can be integrated as a plug-in module in all known trench processes. The particular advantages of this concept according to the invention reside not only in the fact that it opens up the possibility of introducing innovative deep trench submodules, such as for example "wet bottle", "HSG (hemispherical silicon grains)", GPD (gas phase doping)", but also in the fact that it has no impact on costs, since the elimination of the module which has hitherto been required is likely to remove more complexity than is incurred by the new sacrificial collar according to the invention.

According to a preferred refinement, a further liner is provided on the trench wall prior to the filling of the trench in a third thermal process with a third maximum temperature, and the further liner is removed from the lower region of the trench using the first liner as a mask after the removal of the filler material.

According to a further preferred refinement, the second thermal process is a CVD process.

According to a further preferred refinement, the first maximum temperature is at most 500° C.

According to a further preferred refinement, the third thermal process is a conformal deposition process.

According to a further preferred refinement, the filler material is a polymer of organic origin which is thermally stable at between 400° C. and 500° C.

According to a further preferred refinement, the filler material is applied in a spin-on process.

According to a further preferred refinement, the filler material is applied in a deposition process and is then made to flow.

According to a further preferred refinement, the first thermal process comprises a baking step allowing the material to flow and a subsequent curing step for curing or crosslinking purposes.

According to a further preferred refinement, the filler material is removed in an incineration process, in particular in an oxygen plasma process.

According to a further preferred refinement, prior to the filling of the trench a bonding agent is applied or a surface conditioning is carried out, preferably by means of a plasma process.

According to further preferred refinement, the liner is an $Al_2O_3$ liner which is applied in a low-temperature step at between 200° C. and 300° C.

An exemplary embodiment of the present invention is illustrated in the drawings and is explained in more detail in the description which follows.

DETAILED DESCRIPTION

Figure 1A:
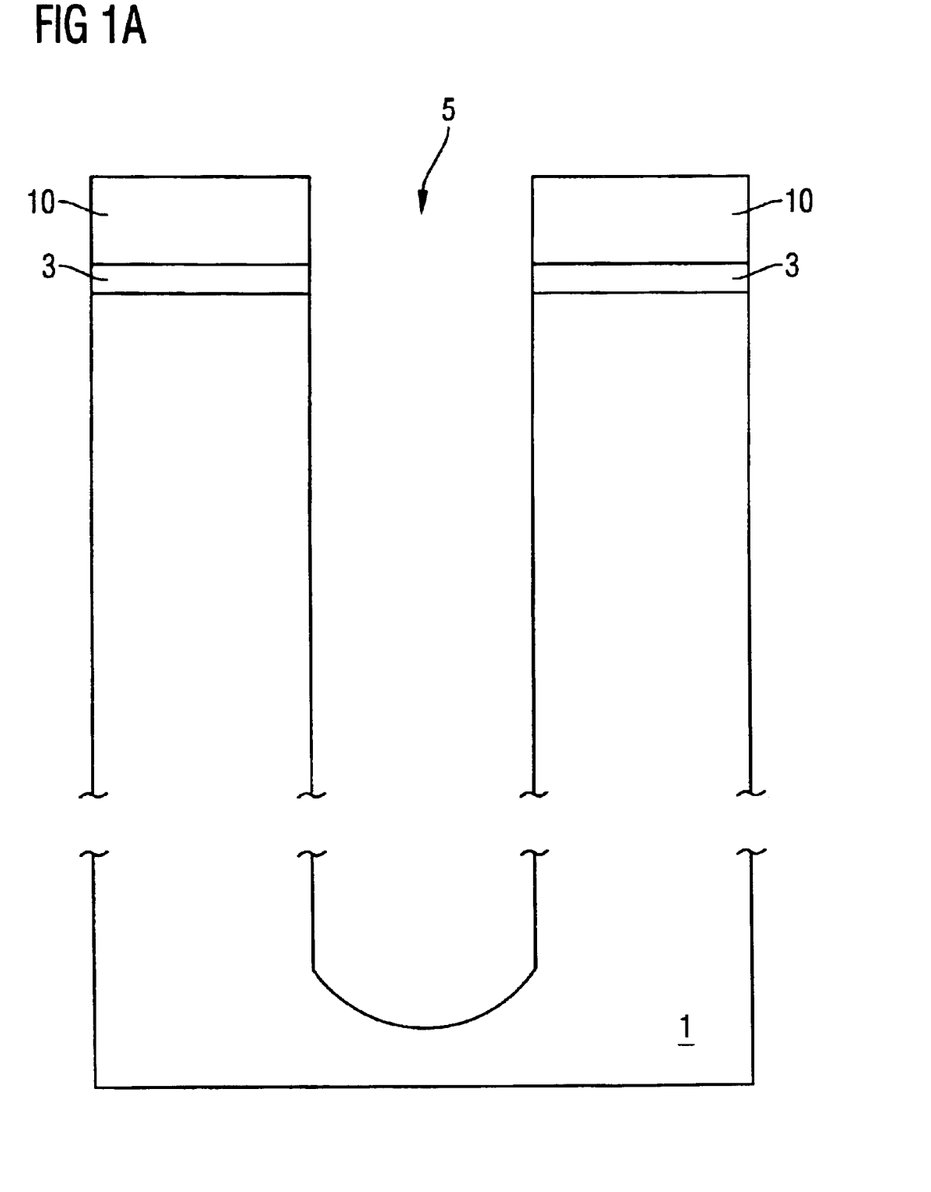
FIGS. 1a–i show successive method steps of an embodiment of the method according to the invention for fabricating a trench capacitor for a DRAM memory cell.

In FIG. 1a, reference numeral 1 denotes a semiconductor substrate into which a trench 5, typically of a depth of 5 $\mu$m and a width of 0.1 $\mu$m, has been introduced. A pad oxide layer 3 and a pad nitride layer 10, the latter being used as an etching mask for the trench etch, are applied to the semiconductor substrate 1.

Figure 1B:
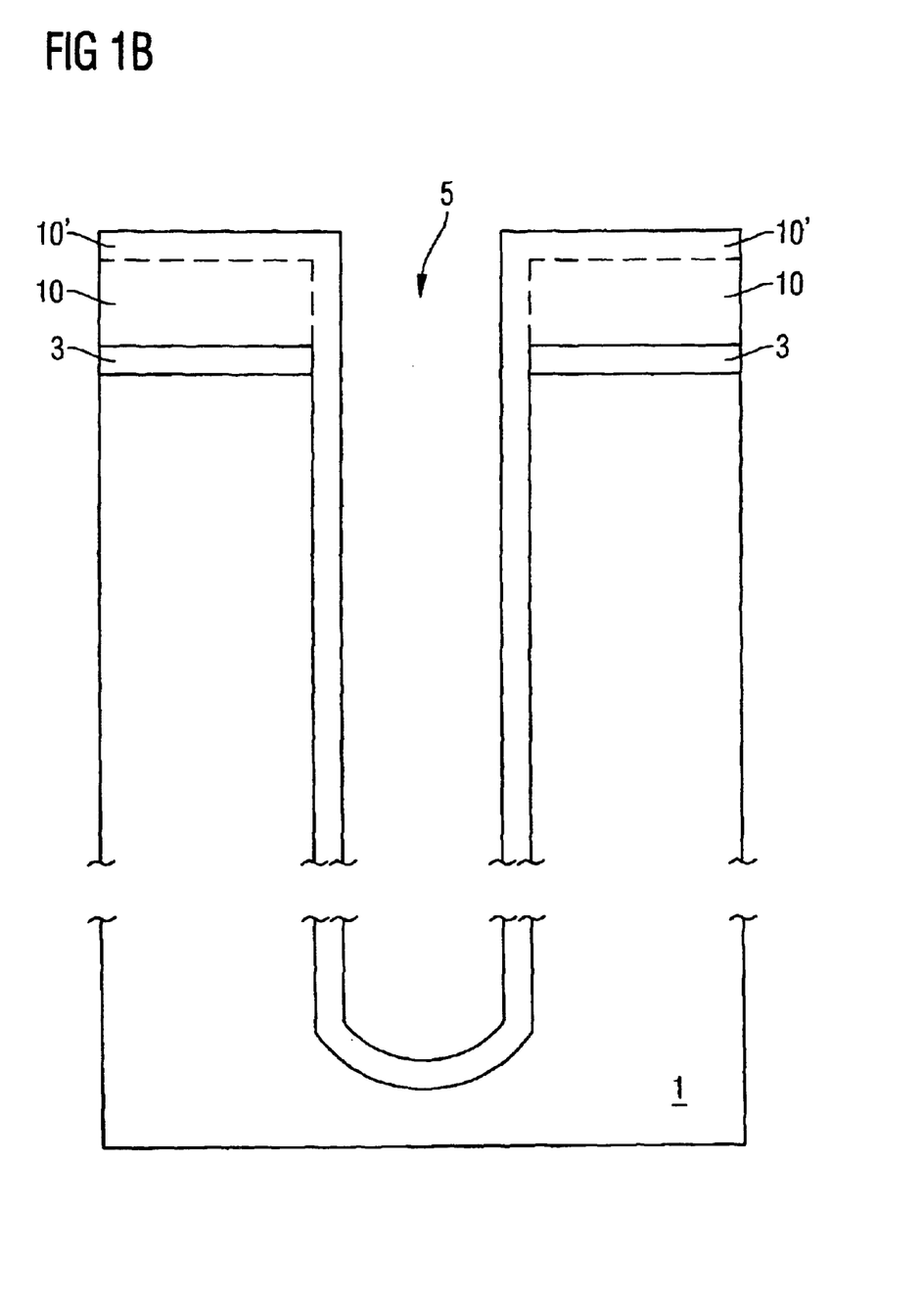

Referring now to the process state shown in FIG. 1b, a silicon nitride liner layer 10' which has a thickness of typically 6 nm is deposited on the resulting structure. This deposition is carried out in a conformal LPCVD process, the process temperature typically being 780° C.

Alternatively, by way of example, it is also possible to carry out an ALD-$Al_2O_3$ process at 300° C.

The liner layer 10' made from silicon nitride ensures that the upper collar region is subsequently impervious to diffusion, for example with regard to a gas phase doping which is subsequently to be carried out or a later etching process. At the same time, the liner layer 10' functions as a base layer for the further filling of the trench 5.

Figure 1C:
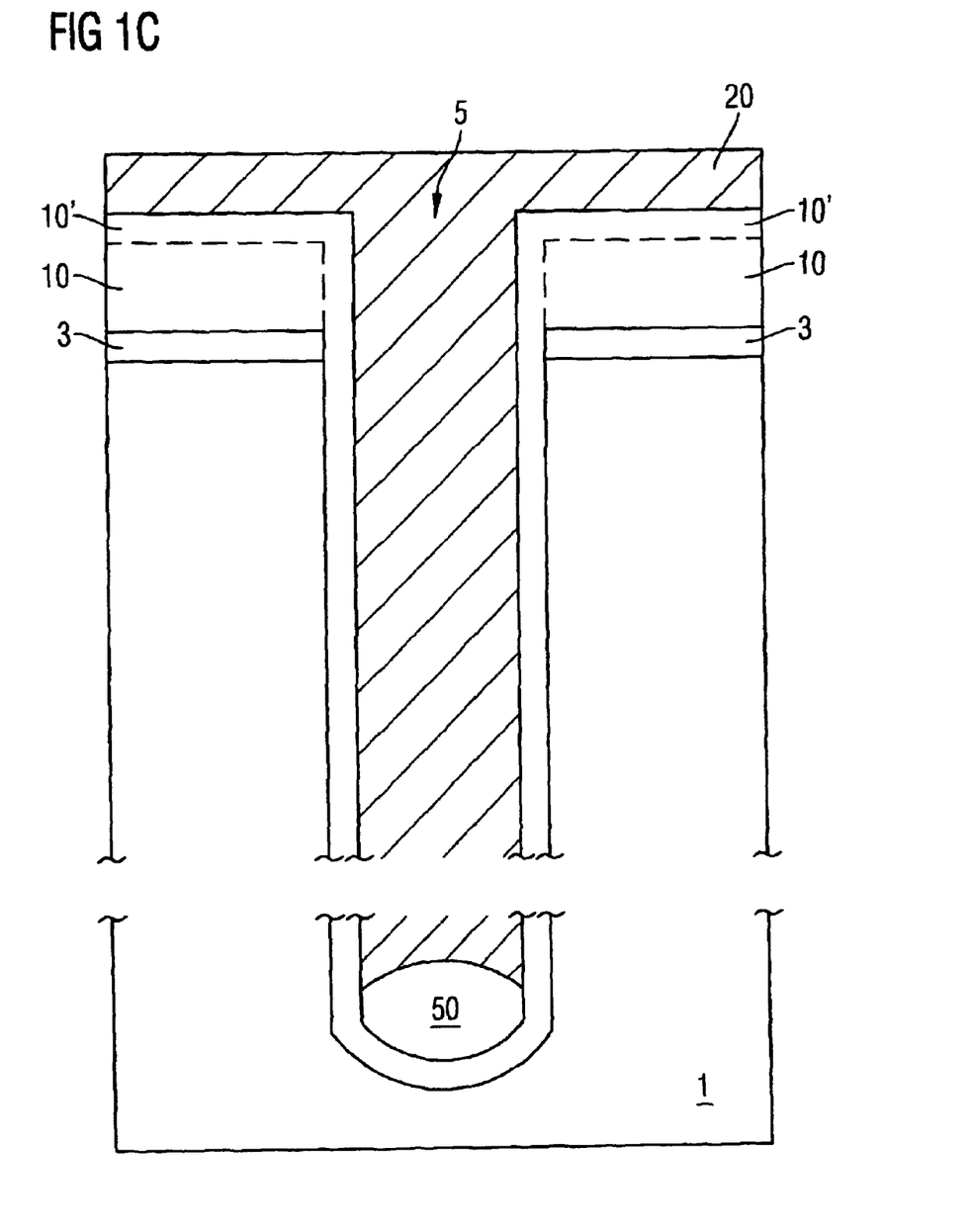

Referring now to FIG. 1c, the trench 5 is in a subsequent process step filled with a liquid filler material 20 without voids. Only at the base of the trench 5 can a small cavity 50 remain, but this would have no disruptive effect.

In this embodiment, the filler material 20 is what is known as a SiLK material which can be introduced with a high aspect ratio, undergoes little shrinkage, can withstand high thermal loads and can be etched and/or stripped without problems.

If appropriate, a bonding agent can be applied prior to the filling, which in the present example is effected by spin-on methods, or alternatively a plasma treatment can be carried out, e.g. for the purpose of slight partial nitriding.

Of course, it is possible to use a CVD process instead of the spin-on process to apply the filler material 20 if the filler material 20 can subsequently still be made to flow.

In the present example, the demands imposed on the filler material 20 are as follows:

a) void-free filling of the trench 5,
b) good planarity in terms of the thickness of the projecting planar layer (typically better than 100 nm for layer thicknesses of 500 nm), above which the filler material 20 usually collects with a slightly increased thickness,
c) thermal stability up to approx. 500° C. (depending on the liner material which follows),
d) ease of etching/stripping, with a high level of selectivity with respect to silicon, silicon dioxide and silicon nitride.

In the present embodiment, a void-free filler material 20 which can be introduced into structures with a high aspect ratio, undergoes little shrinkage, can withstand high thermal loads and can be etched and stripped without problems is selected, this material belonging to the SiLK group which is defined in more detail below. It is used as an underfill for the vertical structuring of the subsequent sacrificial collar and allows a thermal process which preferably takes place at between 400° C. and 500° C.

A recommended candidate for selection for the filler material 20 is, inter alia, a range of organic polymers which have been formed in the development of intermetal dielectrics.

With regard to the required stripping properties, in particular polymer compounds which, after the curing step, substantially form highly crosslinked CH skeletons with the lowest possible oxygen content and preferably no silicon content are suitable.

These are in particular SiLK (Dow Chemical), XLK (Dow Corning), PBO (Sumitomo), and possibly also BCB (Dow Chemical). According to current specialist knowledge, SiLK (Dow Chemical) would be expected to have the most favorable etching properties. These materials are entirely free of silicon and can be etched and incinerated in the same way as a conventional resist.

The SilK materials comprise organic spin-on dielectrics, for example polyaromatic thermoset resin produced by Dow Chemical (SiLK) and Honeywell (FLARE). They also include hybrid organic/inorganic silicate films, which can likewise be spun on, namely hydrogen silsesquioxane (HSQ) (Dow Corning—FOx-XLK), methyl silsesquioxane (MSQ) (JSR-LKD), phenyl silsesquioxane (PSQ) (Shipley—Zirkon), phenyl silsesquioxane (IBM—Dendriglass), siloxane-organic polymer (Honeywell—HOSP), silicate-sol-gel (Schumacher—ELK, MesoELK), silicate-sol-gel (Honeywell—Nanoglass).

After baking the filler material 20, e.g. at 200° C.–300° C., during which step a large proportion of the solvent is expelled, and after the filler material 20 has been made to flow again, a curing step takes place at a temperature which is only insignificantly lower than the deposition temperature of a subsequent liner, i.e. typically at a temperature between 400° C. and 500° C. Bake and cure are to be carried out in such a way that neither a significant shrinkage in volume (inert atmosphere) nor delamination from the straight side wall or the base layer used occurs.

Figure 1D:
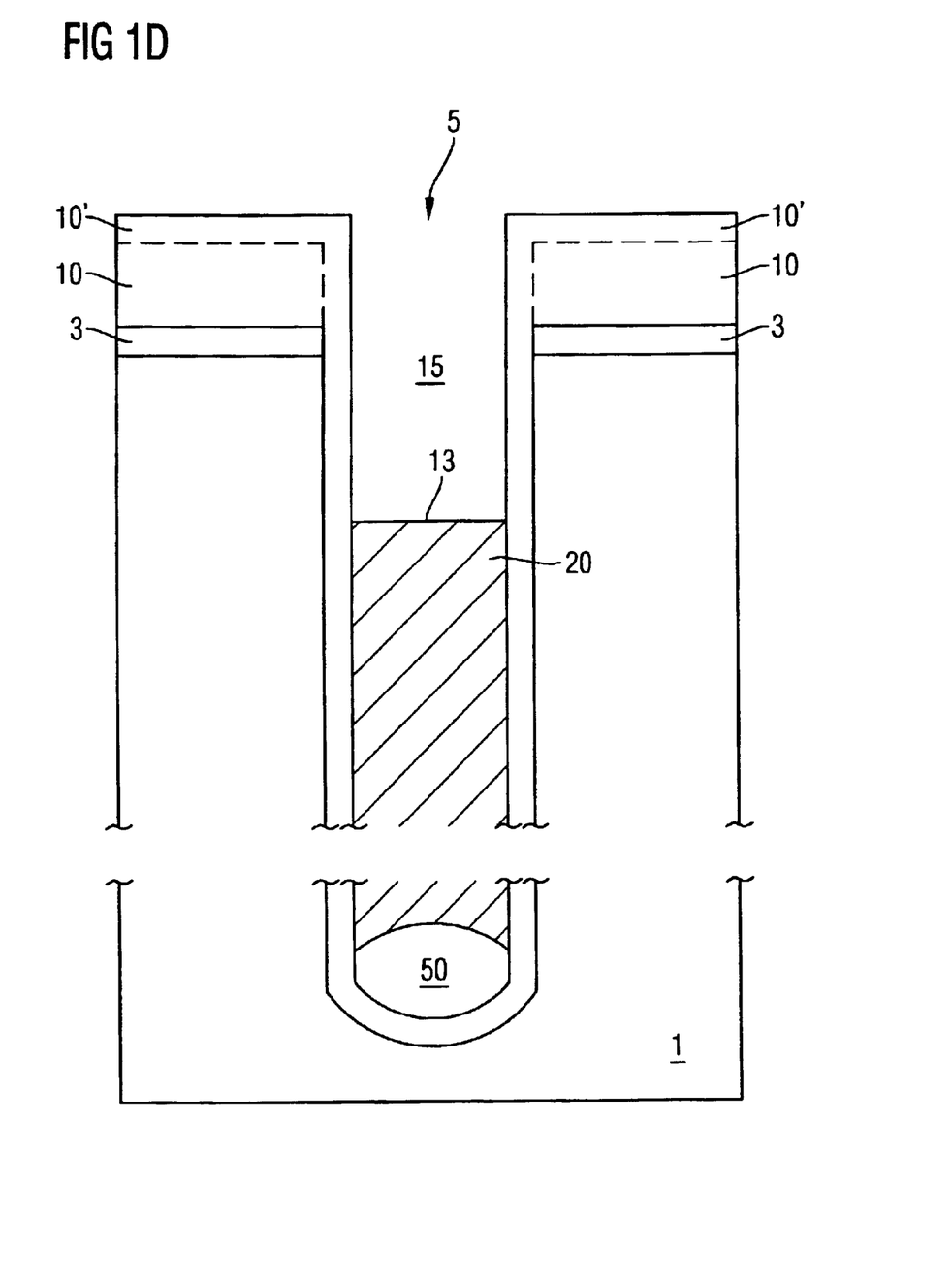

In a subsequent process step, which is explained with reference to FIG. 1d, the filler material 20 is then etched back as far as a boundary surface 13 which defines the collar region 15 of the trench, which typically has a depth of 1–2 $\mu$m.

Figure 1E:
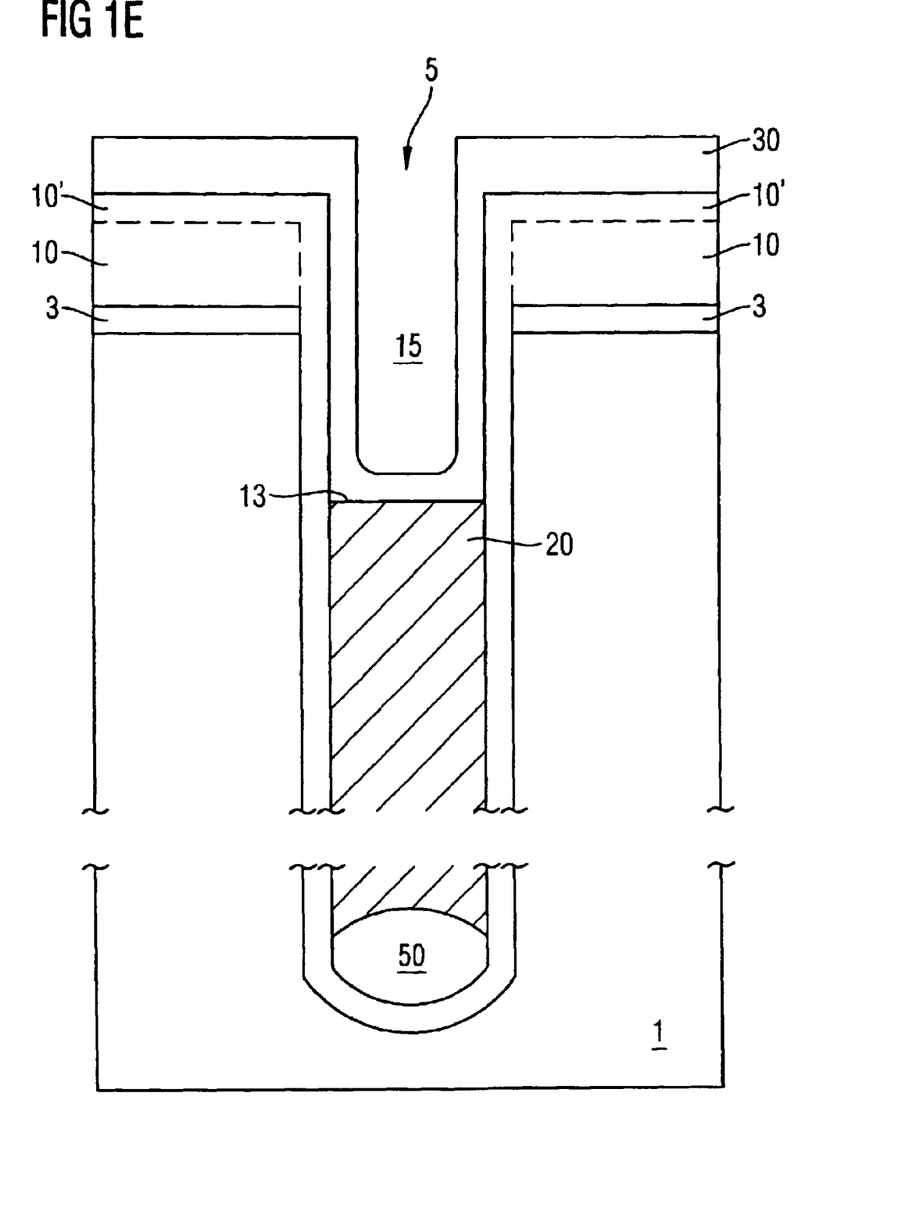

In the next process step, which is illustrated with reference to FIG. 1e, a silicon dioxide liner with a thickness of typically 10 to 20 nanometers is then deposited over the entire surface in a CVD process.

However, depending on the permitted thermal load, it is also possible to deviate to a different liner material, e.g. LPCVD polysilicon, at a deposition temperature of below approx. 500° C. Prior to deposition of the liner 30, it is expedient to separately outgas the SiLK in a separate chamber. Alternatively, it is also possible to carry out an ALD-$Al_2O_3$ deposition at typically 200° C.–300° C.

Figure 1F:
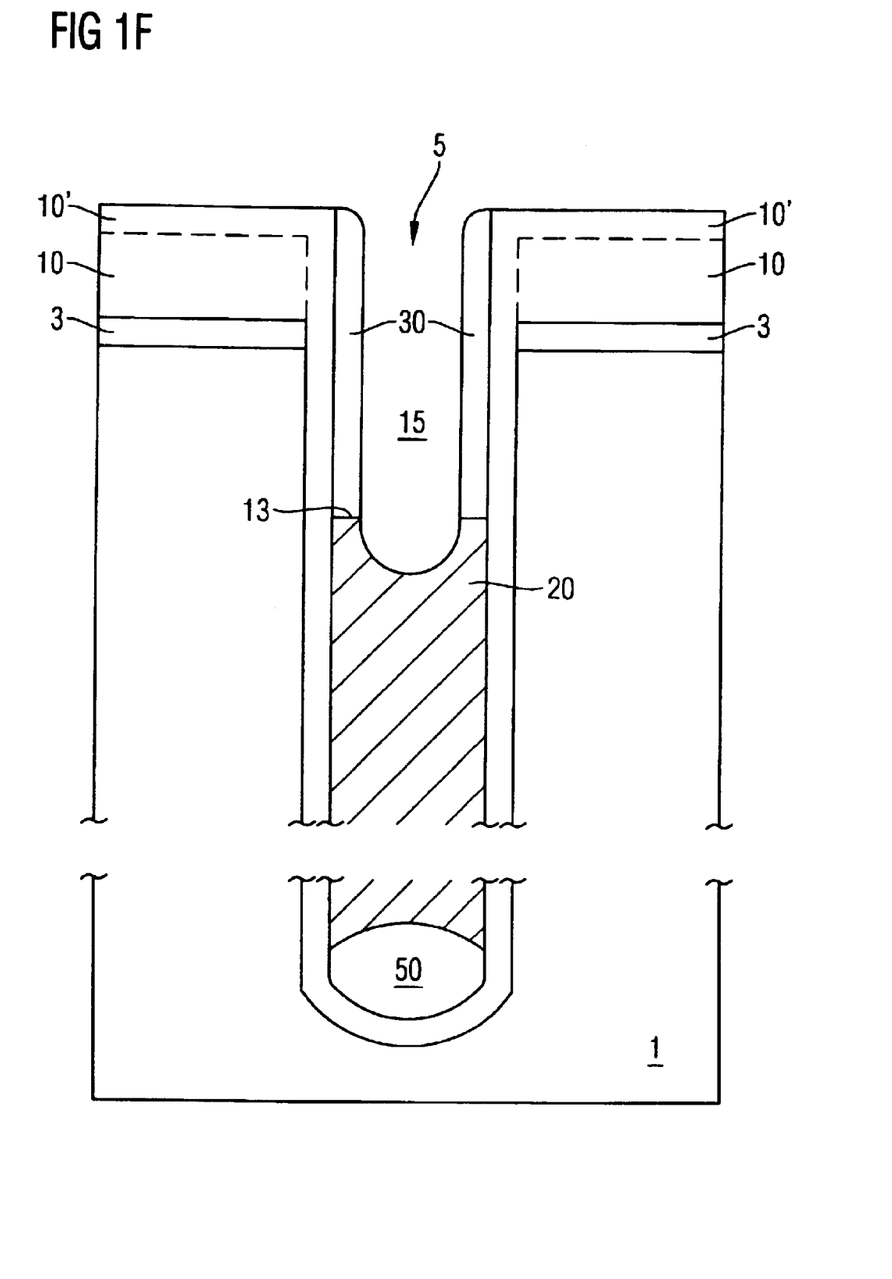

In a subsequent process step, which is shown with reference to FIG. 1f, the oxide liner 30 is then etched back and opened up at the boundary surface 13 with respect to the filler material 20 which remains.

Figure 1G:
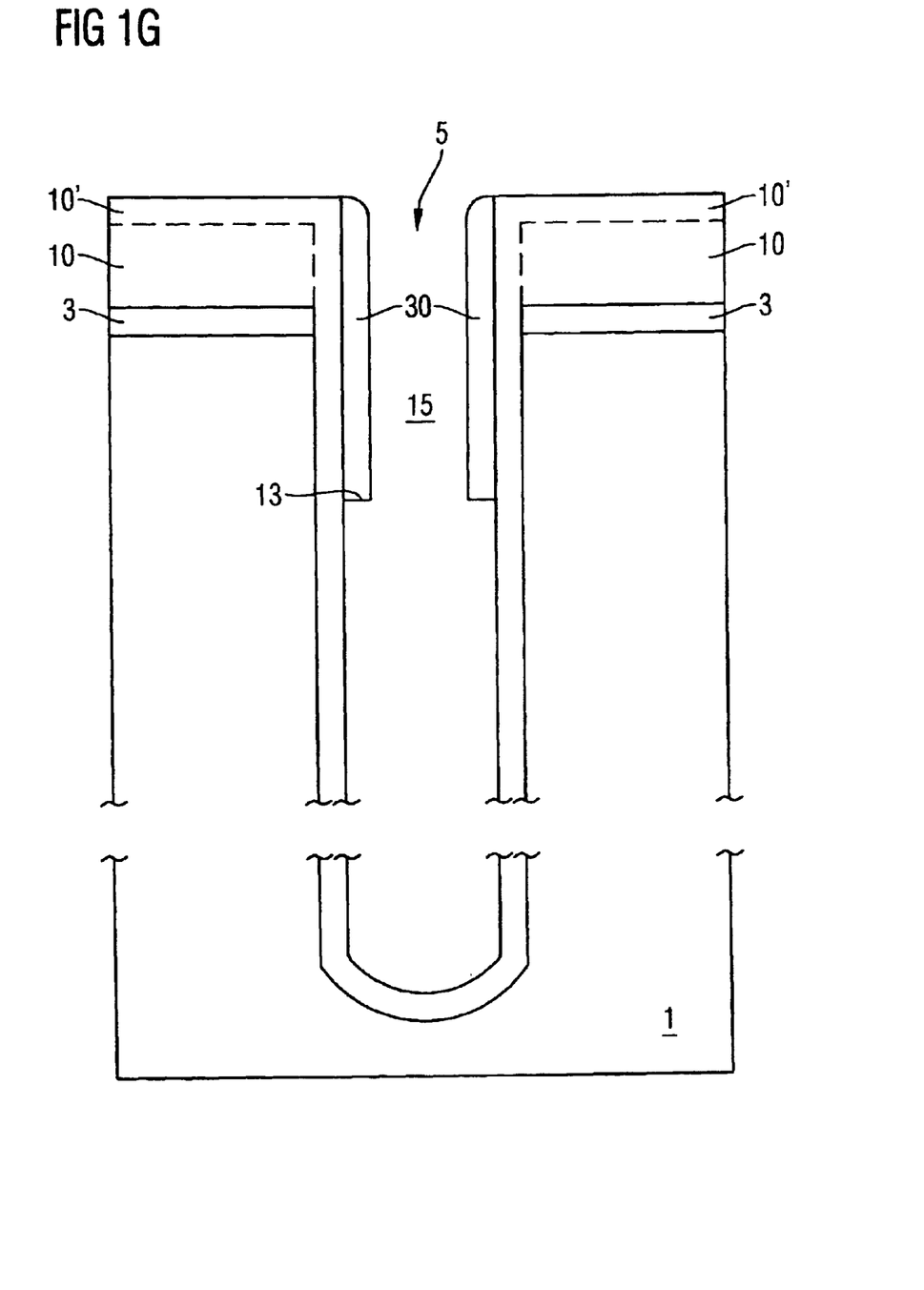

Then, referring to FIG. 1g, the SiLK material is removed, for example by an incineration step, if appropriate with subsequent polymer cleaning, i.e. removal of the polymers which are still in the trench 5. In this case, oxygen plasmas can be used for the etch and a strip can be carried out in a simple incinerator. The stripping can be carried out without the risk of residues being left in the trench 5 and can also be carried out highly selectively with respect to all materials which are conventionally used, such as silicon, silicon dioxide, silicon nitride. Therefore, the silicon nitride layer 10', which in the upper trench region, i.e. in the collar region 15, is masked by the liner 30, is uncovered again in the lower trench region.

Figure 1H:
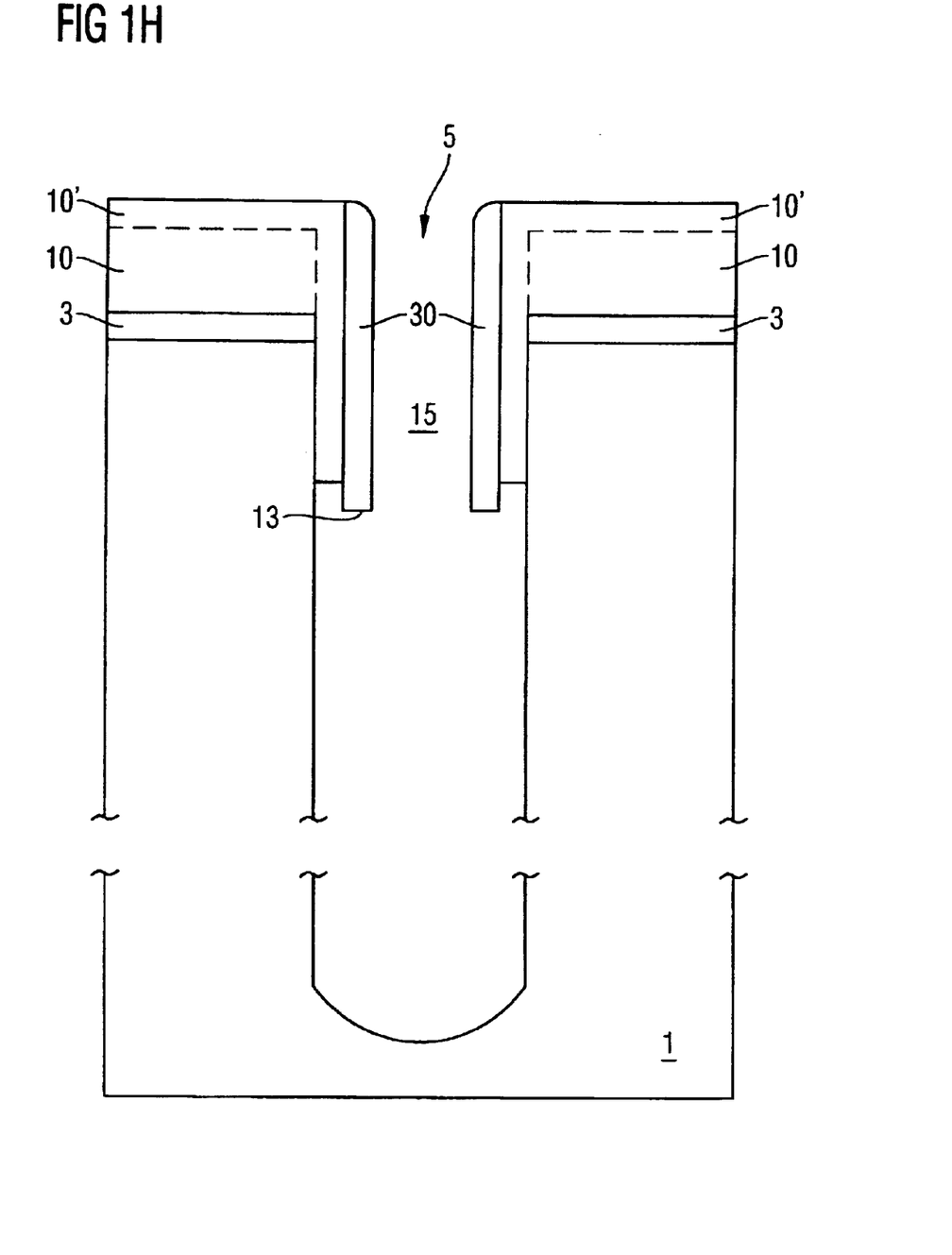

Then, in the process step illustrated in FIG. 1h, a nitride etch is performed for removal of the liner 10' from the lower trench region; this etch has to be selective with respect to the oxide liner 30. As indicated in FIG. 1h, the result may be a slight undercut etch of the liner 30. This etching process may, for example, take place in hot phosphoric acid.

Figure 1I:
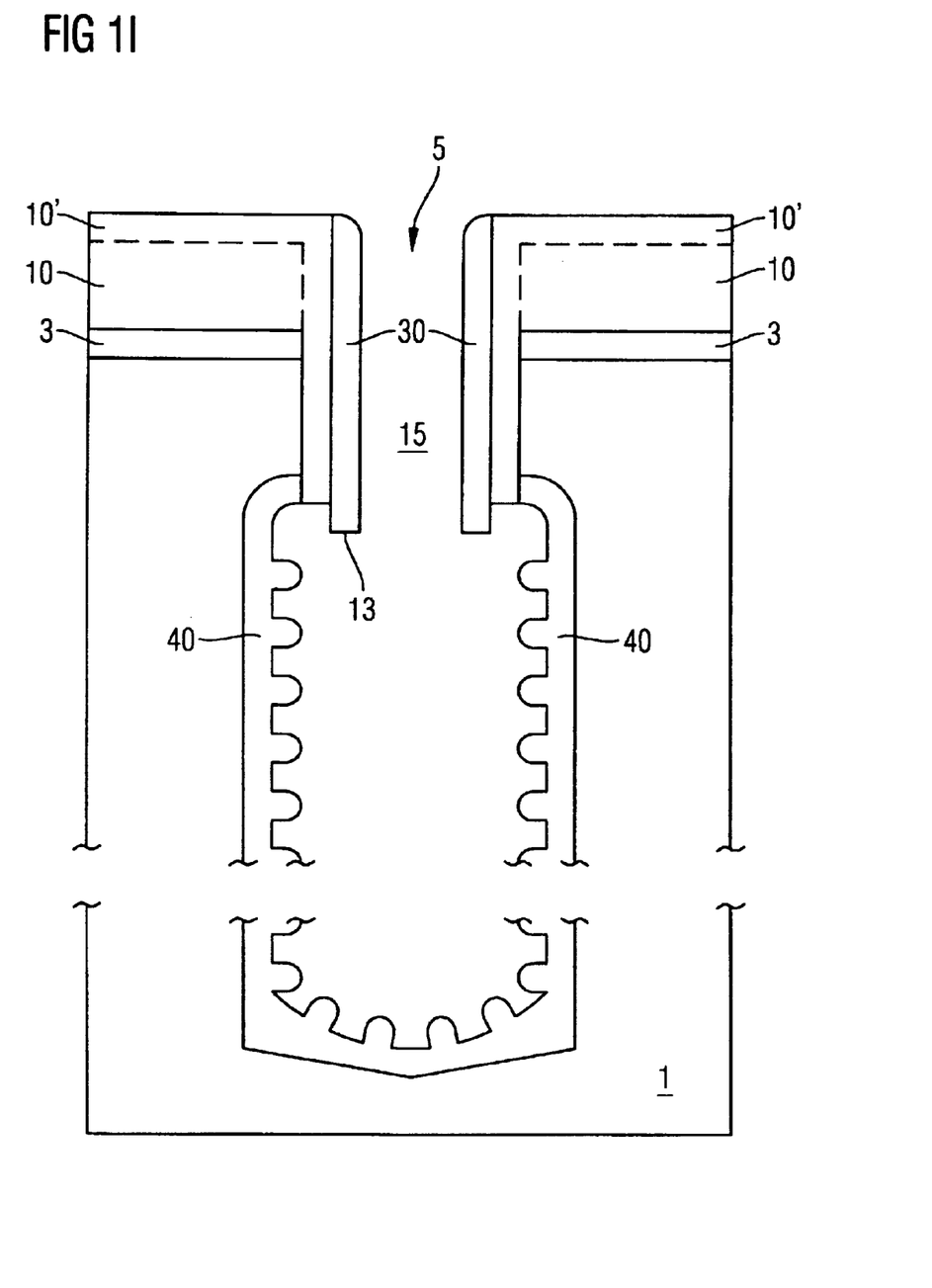

After a sealed collar has thereby been produced in the collar region 15 of the trench 5, it is then possible for further trench processes to take place in the lower part of the trench. By way of example, FIG. 1i illustrates an HSG process which leads to the typical HSG structure 40 in the lower trench region.

A further option consists in carrying out a wet bottle process for the purpose of widening the trench in the lower region. By way of example, a subsequent gas phase doping step is also possible.

The collar stack comprising the liners 10' and 30 in the collar region 15 can be removed following one or more trench processes of this type, for example using HF. If other liner materials are used (for example polysilicon or $Al_2O_3$), they can also be stripped, for example, by wet-chemical means in a silicon etch or hot phosphoric acid. For the silicon strip it is recommended in particular to use what is known as the wet bottle etch, which could be used both to remove the liner silicon and to increase the size of the trenches in the lower region. However, the latter variant is not compatible with an HSG structure.

Then, the conventional integration flow can be continued, by means of which the known trench capacitor, for example for use in a memory cell, is fabricated.

Although the present invention has been described above on the basis of preferred exemplary embodiments, it is not restricted thereto, but rather can be modified in numerous ways.

In particular, the materials cited are given only by way of example and can also be replaced by other materials with suitable properties. The same is true of the above-mentioned etching processes and deposition processes.

In particular, in the present process steps it would also be possible for the initial deposition of the silicon nitride liner 10' to be eliminated altogether if a suitably cold liner process which is able to ensure the required seal with respect to the subsequent processes, e.g. an ALD deposition of $Al_2O_3$ at 200° C.–300° C., is found.

In the case of PECVD silicon nitride, it is known that these liners would have to be a few tens of nm thick. For this reason, but also on account of the more favorable filling characteristics for spin-on materials on nitride (instead of oxide or silicon), in this case in the exemplary embodiment described above it was preferred to combine a sealed LPCVD silicon nitride liner and a PECVD oxide liner.

What is claimed is:

1. A method for fabricating a semiconductor trench structure, the method comprising:
    providing a semiconductor substrate;
    forming a trench in the semiconductor substrate;
    filling the trench with a filler material;
    in a first thermal process having a first maximum temperature, curing the filler material, so that the filler material is thermally stable;
    removing the filler material from an upper region of the trench as far as a boundary surface to define a collar region;
    in a second thermal process having a second maximum temperature that is not significantly higher than the first maximum temperature, depositing a liner on the collar region and the boundary surface;
    removing the liner from the boundary surface, thereby exposing the filler material; and
    removing the filler material from a lower region of the trench.

2. The method according to claim 1, wherein filling the trench with a filler material further comprises selecting a material from the group consisting of a liquid filler and a filler material that is able to flow.

3. The method according to claim 1, further comprising selecting said semiconductor trench structure to be a trench capacitor.

4. The method according to claim 1, further comprising, in a third thermal process having a third maximum temperature,
    providing a second liner on the trench wall prior to filling the trench,
    removing the second liner from the lower region of the trench, and
    using the first liner as a mask after removal of the filler material.

5. The method according to claim 1, further comprising selecting the second thermal process to be a chemical vapor deposition process.

6. The method according to claim 1, further comprising selecting the first maximum temperature to be at most 500° C.

7. The method according to claim 4, further comprising selecting the third thermal process to be a conformal deposition process.

8. The method according to claim 1, further comprising selecting the filler material to be an organic polymer that is thermally stable between 400° C. and 500° C.

9. The method according to claim 1, further comprising applying the filler material using a spin-on process.

10. The method according claim 1, further comprising applying the filler material using a deposition process and causing the filler material to flow.

11. The method according to claim 1, wherein the first thermal process further comprises
    baking the structure to cause the filler material to flow, and
    curing the filler material.

12. The method according to claim 1, further comprising removing the filler material by an incineration process.

13. The method according to claim 12, further comprising selecting the incineration process to be an oxygen plasma process.

14. The method according to claim 1, further comprising applying a bonding agent to a surface of the trench prior to filling the trench.

15. The method according to claim 1, further comprising conditioning a surface of the trench prior to filling the trench.

16. The method according to claim 15, further comprising using a plasma process for conditioning the surface of the trench.

17. The method according to claim 1, further comprising selecting the liner to be an $Al_2O_3$ liner.

18. The method according to claim 17, further comprising,
    applying the $Al_2O_3$ liner at a temperature between 200° C. and 300° C.

* * * * *